United States Patent [19]

Sedlak

[11] Patent Number: 4,956,035

[45] Date of Patent: Sep. 11, 1990

[54] COMPOSITION AND PROCESS FOR PROMOTING ADHESION ON METAL SURFACES

[75] Inventor: Rudolf P. Sedlak, Palo Alto, Calif.

[73] Assignee: RD Chemical Company, Mountain View, Calif.

[21] Appl. No.: 388,337

[22] Filed: Aug. 1, 1989

[51] Int. Cl.$^5$ ............................ C23F 1/00; B44C 1/22; C03C 15/00; C03C 25/06

[52] U.S. Cl. .................... 156/664; 156/634; 156/656; 156/659.1; 156/666; 252/79.4; 427/309

[58] Field of Search ............ 156/634, 656, 659.1, 156/664, 666; 252/79.2, 79.4; 427/309; 134/3, 41

[56] References Cited

U.S. PATENT DOCUMENTS

| | | | |
|---|---|---|---|
| 4,046,620 | 9/1977 | Andrascek et al. | 156/666 |
| 4,057,554 | 11/1977 | Redmore et al. | 252/79.4 X |
| 4,460,479 | 7/1984 | Mulder | 252/79.4 |
| 4,547,304 | 10/1985 | McEntire et al. | 156/666 X |

*Primary Examiner*—William A. Powell
*Attorney, Agent, or Firm*—Irell & Manella

[57] ABSTRACT

The adhesion of organic chemicals to metal surfaces is enhanced by treating the metal surface with a composition comprising an etching component, a quaternary ammonium cationic surfactant, and a solubilizing secondary surfactant.

10 Claims, No Drawings

COMPOSITION AND PROCESS FOR PROMOTING ADHESION ON METAL SURFACES

TECHNICAL FIELD

This invention relates to the field of metal surface treatment, particularly for use in chemical treatment and composition useful for promoting adhesion of organic compounds to metal surfaces.

BACKGROUND OF THE INVENTION

Printed circuit boards have long been used in the fabrication of electronic components. Printed circuitry provides a support for discrete components, while providing most of the electrical interconnections between components. The circuitry pattern may be transferred to the board by photographic or lithographic techniques, thus permitting mass production without labor-intensive soldering. Circuit boards are generally manufactured from epoxy resin (typically containing reinforcing fiberglass fibers) clad on one or both sides with copper foil. The circuit pattern is applied to one or both sides marking the pathways with a resist, etching the non-masked copper from the board, and removing the resist.

Single and double sided boards are inherently limited with regard to the density of components they can support and the amount of current they can carry. Printed circuit paths cannot cross, thus requiring careful arrangement of components which may be suboptimum where components may interfere electromagnetically or generate excessive heat. The solution now used is the multilayer circuit board. Several single or double sided circuit boards are prepared, and are laminated together (separated by an appropriate dielectric, typically partially-cured resin) under pressure and heat to form an integral composite board having several layer of circuitry embedded within.

The circuit paths are generally applied to the boards using a photoresist technique. A photoresist material is applied either as a liquid, or more commonly, as a film. The treated board is then exposed to uv light through a negative image of the circuit pattern. The radiation cures the photoresist, causing it to harden. Then, the unexposed portions of the resist are removed, typically with an alkaline solution, and the exposed copper is etched using ammoniacal copper chloride, cupric chloride, acid or ferric chloride. The hardened photoresist prevents copper beneath the circuit pattern from etching. The hardened resist is then removed, leaving the circuit pattern in copper.

Modern circuit boards are designed with circuit paths as narrow as 0.1 mm, with little separation between adjacent paths. Thus, it is critical that the photoresist remain in place on the copper-clad board when applied. Any displacement or lifting of the photoresist during processing may cause inaccuracies in the circuit pattern, and may cause mis-registration from layer to layer of multi-layer board, as the layers are connected by communicating holes. To insure adhesion between the copper surface and the photoresist resin, the metal surface is generally roughened. Where the metal layer and its supporting board are sufficiently sturdy, this may be accomplished by mechanical means, for example, by scrubbing with a wire brush. However, the boards currently used for internal layers of multilayer circuit boards are generally too thin to withstand such vigorous mechanical treatment. The conventional procedure calls for etching the copper surface with acid peroxide blends or ferric chloride to provide a rough surface.

Another metal-resin adhesion problem occurs between the finished circuit paths and the solder mask. In this instance, etching the circuit paths may leave the board with a dull appearance. As the solder mask is applied to the outer, visible surface of the board, a dull appearance is detrimental.

DISCLOSURE OF THE INVENTION

In the present invention, the adhesion between a metal surface and an organic compound, especially a polymer or resin, is enhanced by etching with a mild etching solution containing a quaternary ammonium cationic surfactant. Surprisingly, etching using an effective amount of quaternary ammonium cationic surfactant provides a smooth, polished surface rather than a rough, etched appearance. Thus, this technique is particularly useful for binding organic compounds to metal surfaces where the metal surface will remain visible. More surprising still is that metal-resin adhesion is substantially enhanced over prior art techniques.

One aspect of the invention is a composition for promoting the adhesion of an organic compound to a metal surface, which comprises an etching solution, an effective amount of a quaternary ammonium cationic surfactant, and a solubilizing amount of a secondary surfactant or solvent. This composition is particularly useful for improving photoresist adhesion to copper-clad circuit boards, and for improving adhesion of solder masks to printed circuits.

Another aspect of the invention is the method for improving the ability of a metal surface to bind an organic compound, which comprises contacting the metal surface with a composition comprising an etching solution, an effective amount of a quaternary ammonium cationic surfactant, and a solubilizing amount of a secondary surfactant.

MODES OF CARRYING OUT THE INVENTION

A. DEFINITIONS

The term "etching composition" refers to a composition, generally an aqueous solution, which is capable of reacting with a metal surface to form microscopic pits. Etching compositions are typically solutions of $FeCl_3$ or $CuCl_2$ in HCl, peroxysulfuric or peroxyphosphoric acid, or nitric acid.

The term "quaternary ammonium cationic surfactant" refers to a compound of the general formula $R_1R_2R_3R_4N^+X^-$, where $R_{1-4}$ are typically hydrocarbon chains, and X is an anionic counter ion. The hydrocarbon chains may be saturated or unsaturated, including aromatic, and may include heteroatoms, for example oxygen. Suitable quaternary ammonium cationic surfactants are hydrophobic, having an HLB value $\leq 12$, preferably $\leq 10$. The surfactant must also be chemically stable in etching compositions. Exemplary quaternary ammonium cationic surfactants within the scope of this invention include, without limitation, alkyl-dimethylammonium benzyl halides such as Hyamine ® 3500, dimethyldicocoammonium halides such as Arquad ® 2C75, Adogen ® 464, Exxon Emulsifier 4, and the like. Presently preferred quaternary surfactants include Hyamine ® 3500, Arquad ® 2C75, Adogen ® 464, Exxon Emulsifier 4, and M-Quat JO 50. The "effective amount" of quaternary ammonium cationic surfactant depends upon the particular surfactant selected, but will generally range from about 10% of the critical micelle concentration (CMC) up to about 5% by weight, preferably from about 0.0001 weight % to about 1 weight %, most preferably about 0.1–0.5 weight %.

The term "secondary surfactant" as used herein refers to a surfactant capable of maintaining the quaternary ammonium cationic surfactant in solution in the etching composition. Secondary surfactants are selected from nonionic surfactants and polar organic solvents which are chemically stable in the etching composition and do not react with the quaternary ammonium cationic surfactant, preferably glycol ether surfactants. Quaternary ammonium surfactants having a high HLB value may also be used. Presently preferred secondary surfactants include ethylene glycol monobutyl ether, diethylene glycol monobutyl ether, dipropylene glycol monomethyl ether, glyme, diglyme, butyl cellusolve, and the like. A "solubilizing amount" of the secondary surfactant is that amount which is necessary to maintain a single phase composition containing an effective amount of quaternary ammonium cationic surfactant in an etching composition. The exact amount necessary will vary depending upon the particular etching composition and quaternary surfactant selected and their concentrations, and the particular secondary surfactant selected, but will generally range from about 0.01 weight % up to about 25%, preferably about 1–10%. The upper limit is essentially arbitrary, and is imposed only for economic considerations.

B. GENERAL METHOD

The compositions of the invention are useful in general for treating metal surfaces to promote adhesion of organic molecules, such as pigments, antioxidant coatings, polymeric resins, and the like. In particular, the compositions are useful for insuring the adhesion of photoresist resins and films to copper clad circuit boards, and the adhesion of solder masks to printed circuits.

The compositions of the invention are prepared by mixing the quaternary ammonium cationic surfactant and the secondary surfactant with an etching composition, such as aqueous $FeCl_3$ or peroxysulfuric acid. It is generally preferred to add the secondary surfactant to the etching composition prior to adding the quaternary surfactant. Alternatively, one may add the two surfactants to a suitable quantity of water, followed by addition of the etching component in concentrated form (e.g., solid $FeCl_3$, or concentrated peroxysulfuric acid). If desired, one may also add an antifoaming agent which is stable to the chemical conditions of the etch composition.

Metal surfaces may be treated using the compositions of the invention by immersion in a bath, by pouring, brushing, wiping, or spraying the composition on the surface, and the like. "Metal surfaces" include copper, nickel, tin, zinc, aluminum, brass, iron, steel, stainless steel, titanium, silver, and other metals and alloys. Bath immersion is presently preferred for treating copper-clad circuit boards. In general, the circuit board (or other metal surface) is contacted with the composition and allowed to react for about 5 seconds to about 20 minutes (the upper limit is determined by the amount of metal loss acceptable). The reaction time is preferably about 15 sec to about 120 sec, most preferably about 1 minute. The treatment is preferably conducted at ambient temperature, although it may be conducted from about the freezing point of the composition to the temperature at which phase separation occurs. If conducted at temperatures other than about 20°–25° C., the reaction time must be adjusted accordingly. The surface is then removed from contact, and rinsed with water to remove any excess. It is currently believed that a monomolecular layer of quaternary ammonium surfactant remains adsorbed on the metal surface. However, this theory is not to be construed as limiting the present invention.

Suitable surfactants may be identified by the visually observable results upon removing a treated metal surface from the rinse water. Conventional etching treatments are selected for absence of water break, i.e., water sheets evenly off the metal surface upon removal from the rinse bath. In contrast, suitable surfactants in the practice of the present invention produce a water break: a "speckled" appearance indicates an inferior surfactant for purposes of the present invention. The efficacy of surfactants selected in this manner may then be confirmed by applying an organic composition to the treated metal surface (for example, paint, decal, photoresist film), and determining the force necessary to separate the organic compound from the metal. Where a polymer film is used, one can measure the force necessary to strip the film. Alternatively, one can determine adhesion practically, by treating a test metal surface, applying a photoresist, exposing, developing, and etching the photoresist, and examining the resulting etched product for imperfections. Imperfections in the resulting pattern indicate inadequate adhesion of the photoresist.

C. EXAMPLES

The examples presented below are provided as a further guide to the practitioner of ordinary skill in the art, and are not to be construed as limiting the invention in any way.

EXAMPLE 1

(Compositions)

(A) A composition of the invention was prepared as follows:

| | |
|---|---|
| $FeCl_3$ (40% solution) | 25.0% |
| Arquad ® 2C-75 | 0.30% |
| Hyamine ® 3500 | 0.09% |
| Adogen ® 464 | 0.04% |
| CO-630 (nonylphenol ethoxylate) | 5.0% |
| water | qs |

Adogen ® was obtained from Sherex Chemical Co., Inc., Dublin, Ohio. Hyamine ® 3500 was obtained from Lonza Inc, Fair Lawn, N.J. Arquad ® 2C-75 was obtained from Akzo Chemical Division, Chicago, Ill. CO-630 was obtained from GAF Chemicals Corp., Wayne, N.J. The components were mixed together to form a concentrated solution. The concentrate was diluted to 50% with water prior to use.

A bath was prepared with the above composition, and a copper coupon inserted. After 1 min of moderate agitation in the bath, the coupon was removed, and was dipped in a fresh water bath to rinse. Upon removal from the rinse bath, it was observed that the water streamed off the coupon, but not in an unbroken sheet.

(B) Another composition of the invention was prepared as follows:

| | |
|---|---|
| FeCl₃ (40% solution) | 90.0% |
| Diethylene glycol monobutyl ether | 9.85% |
| Exxon Emulsifier 4 | 0.05% |
| Hyamine ® 3500 (50% solution) | 0.05% |
| Arquad ® 2C-75 | 0.05% |

Hyamine ® 3500 was obtained from Lonza Inc, Fair Lawn, N.J. Arquad ® 2C-75 was obtained from Akzo Chemical Division, Chicago, Ill. Emulsifier 4 was obtained from Exxon. The components were mixed together to form a homogeneous solution.

The composition was used undiluted to treat the surface of Alloy 42, Kovar, and type 316 (low carbon) stainless steel. Sheets of each metal (24"×36") were treated using a spray conveyor chamber. Alloy 42 and Kovar were treated at 120° F., while type 316 was treated at 145° F. Control coupons were treated with ferric chloride solution in the absence of surfactants.

Coupons treated with the composition of the invention exhibited a smoothly etched surface and irregular water break. Coupons treated with ferric chloride alone exhibited a coarsely etched surface smooth water sheeting action.

EXAMPLE 2

(Adhesion of Photoresist Films)

Metal sheets were prepared as described in Example 1(B) above using a composition of the invention or a control etch lacking surfactant. The prepared sheets were then coated with Riston ® 4100 photoresist film (DuPont Corporation), and exposed using an integrated circuit lead frame pattern (approximately 1"×1", spaced about 0.125" apart) providing about 670 patterns per sheet. The exposed sheets were developed with 1% Na₂CO₃, and etched to completion with 40% FeCl₃. This process results in linear strips of 8 lead frames, suitable for use in integrated circuit packages.

The resulting lead frame strips were examined for rate of failure or imperfect pattern, which indicates lifting or shifting of the photoresist during processing. Sheets treated with the composition of the invention exhibited much lower failure rates than sheets treated using prior art methods (in the absence of surfactants). Thus, the compositions of the invention provide superior photoresist adhesion.

What is claimed:

1. A composition for improving adhesion of organic compounds to metal surfaces, said composition comprising:
   an etching composition;
   an effective amount of a quaternary ammonium cationic surfactant; and
   a solubilizing amount of a secondary surfactant.

2. The composition of claim 1, wherein said secondary surfactant is selected from nonionic surfactants and polar organic solvents.

3. The composition of claim 2, wherein said secondary surfactant is an ethoxylated nonylphenol.

4. The composition of claim 1, wherein said etching composition comprises FeCl₃, CuCl₂, peroxysulfuric acid, or peroxyphosphoric acid.

5. A composition for improving adhesion of organic compounds to metal surfaces, said composition comprising:
   an etching composition;
   about 0.0001 weight % to about 5 weight % of a quaternary ammonium cationic surfactant; and
   about 0.01 weight % to about 25% of a secondary surfactant.

6. The composition of claim 5, which comprises:
   about 0.1–0.5 weight % quaternary ammonium cationic surfactant; and
   about 1–10 weight % secondary surfactant.

7. The composition of claim 6, wherein said secondary surfactant is an ethoxylated nonylphenol.

8. A process for improving the adhesion of organic compounds to metal surfaces, said process comprising:
   contacting said metal surface with a composition comprising an aqueous etching composition, an effective amount of a quaternary ammonium cationic surfactant, and a solubilizing amount of a secondary surfactant; and
   rinsing said metal surface with water.

9. The process of claim 8, wherein said etching composition comprises FeCl₃, and said secondary surfactant is an ethoxylated nonylphenol.

10. A process for improving the adhesion of photoresist to a board having a copper surface, comprising:
    contacting said copper surface with a composition comprising an aqueous etching composition, an effective amount of a quaternary ammonium cationic surfactant, and a solubilizing amount of a secondary surfactant; and
    rinsing said metal surface with water.

* * * * *